(12) United States Patent
Lendvay et al.

(10) Patent No.: US 11,467,995 B2
(45) Date of Patent: Oct. 11, 2022

(54) PIN MAPPING FOR MEMORY DEVICES

(71) Applicant: Micron Technology, Inc., Boise, ID (US)

(72) Inventors: William A. Lendvay, Boise, ID (US); Scott R. Cyr, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/108,742

(22) Filed: Dec. 1, 2020

(65) Prior Publication Data
US 2022/0171730 A1 Jun. 2, 2022

(51) Int. Cl.
*G06F 13/38* (2006.01)
*G06F 30/392* (2020.01)
*G06F 13/40* (2006.01)

(52) U.S. Cl.
CPC .......... *G06F 13/385* (2013.01); *G06F 30/392* (2020.01); *G06F 13/4022* (2013.01)

(58) Field of Classification Search
CPC ... G06F 13/385; G06F 30/392; G06F 13/4022
See application file for complete search history.

(56) References Cited

U.S. PATENT DOCUMENTS

| | | | | |
|---|---|---|---|---|
| 7,584,448 B1* | 9/2009 | Reynolds | ............... | G06F 30/34 716/138 |
| 10,365,833 B2* | 7/2019 | Hollis | ............... | G06F 13/4022 |
| 2005/0097280 A1* | 5/2005 | Hofstee | ............... | G06F 13/1652 711/E12.066 |
| 2005/0172037 A1* | 8/2005 | Downing | ............ | G06F 13/4068 710/1 |
| 2005/0268048 A1* | 12/2005 | Hofstee | ................. | H04L 63/168 711/147 |
| 2006/0230375 A1* | 10/2006 | Casey | ................... | G06F 30/392 716/117 |
| 2007/0124532 A1* | 5/2007 | Bennett | ............... | G06F 13/1684 711/100 |
| 2010/0167557 A1* | 7/2010 | Hoang | ................... | H05K 1/117 439/62 |
| 2011/0258391 A1* | 10/2011 | Atkisson | ............. | G06F 12/0875 711/E12.017 |
| 2016/0071608 A1* | 3/2016 | Bronner | ................. | G11C 16/26 365/185.18 |
| 2016/0098061 A1* | 4/2016 | Teh | .......................... | G06F 30/34 713/600 |
| 2016/0292095 A1* | 10/2016 | Hinkle | ................... | G06F 3/0635 |
| 2022/0011934 A1* | 1/2022 | Tatapudi | .................. | G11C 7/10 |

* cited by examiner

*Primary Examiner* — Henry Tsai
*Assistant Examiner* — Aurangzeb Hassan
(74) *Attorney, Agent, or Firm* — Holland & Hart LLP (57) ABSTRACT

Methods, systems, and devices for pin mapping for memory devices are described. An apparatus may include a memory array, a plurality of pins, a selector, and a mapping component. The memory array may include a plurality of data lines coupled with a plurality of memory cells. The mapping component may be configured to map a set of data lines to a first set of pins when the selector reflects a first state and to a second set of pins when the selector reflects a second state. The first and second set of pins may have a same quantity of pins. The second set of pins may include pins that are otherwise unused in the second state. The mapping component may be configured to selectively couple unused pins to a fixed potential.

21 Claims, 7 Drawing Sheets

PIN MAPPING FOR MEMORY DEVICES

FIELD OF TECHNOLOGY

The following relates generally to one or more systems for memory and more specifically to pin mapping for memory devices.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Current DRAM devices have first and second configurations that are selectable at a programming step (e.g., via a fuse) either prior to, or post packaging. The first configuration may have a first bus width (e.g., x8), and the second configuration may have a second bus width (e.g., x4). The second configuration uses the lowest numbered pins of pins of the first configuration. However, some of the lowest pins may have relatively high levels of cross-talk to each other.

According to various aspects described herein, a memory device (e.g., DRAM device) may have a third configuration (e.g., additional configuration or modified version for the second configuration) where the pins of the third configuration are mapped from pins of the first configuration that are farther away from each other and therefore subject to less cross-talk. In alternative or additional aspects, the other pins (pins of the first configuration not used on the second or third configurations) coupled to ground as they may be in-between (e.g., pads of the die or the traces of the package) the pins of the third configuration and therefore offer additional cross-talk protection Features of the disclosure are initially described in the context of systems and dies as described with reference to FIGS. 1 and 2. Features of the disclosure are described in the context of pinouts, a package layout and a schematic, as described with reference to FIGS. 3-5. These and other features of the disclosure are further illustrated by and described with reference to an apparatus diagram and a flowchart that relate to pin mapping for memory devices as described with reference to FIGS. 6-7.

Figure 1:
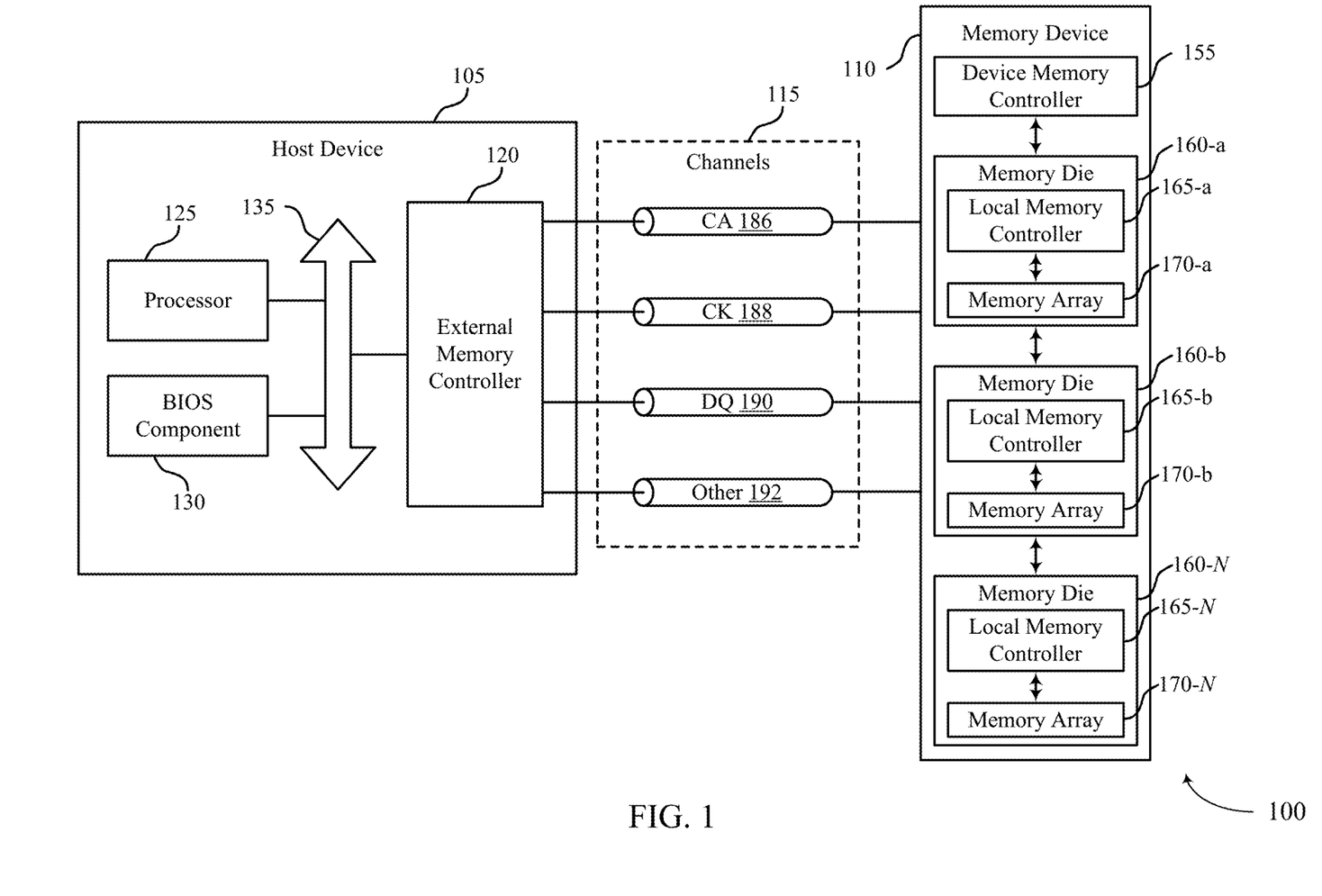
FIG. 1 illustrates an example of a system that supports pin mapping for memory devices in accordance with examples as disclosed herein.

FIG. 1 illustrates an example of a system 100 that supports pin mapping for memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

Figure 2:
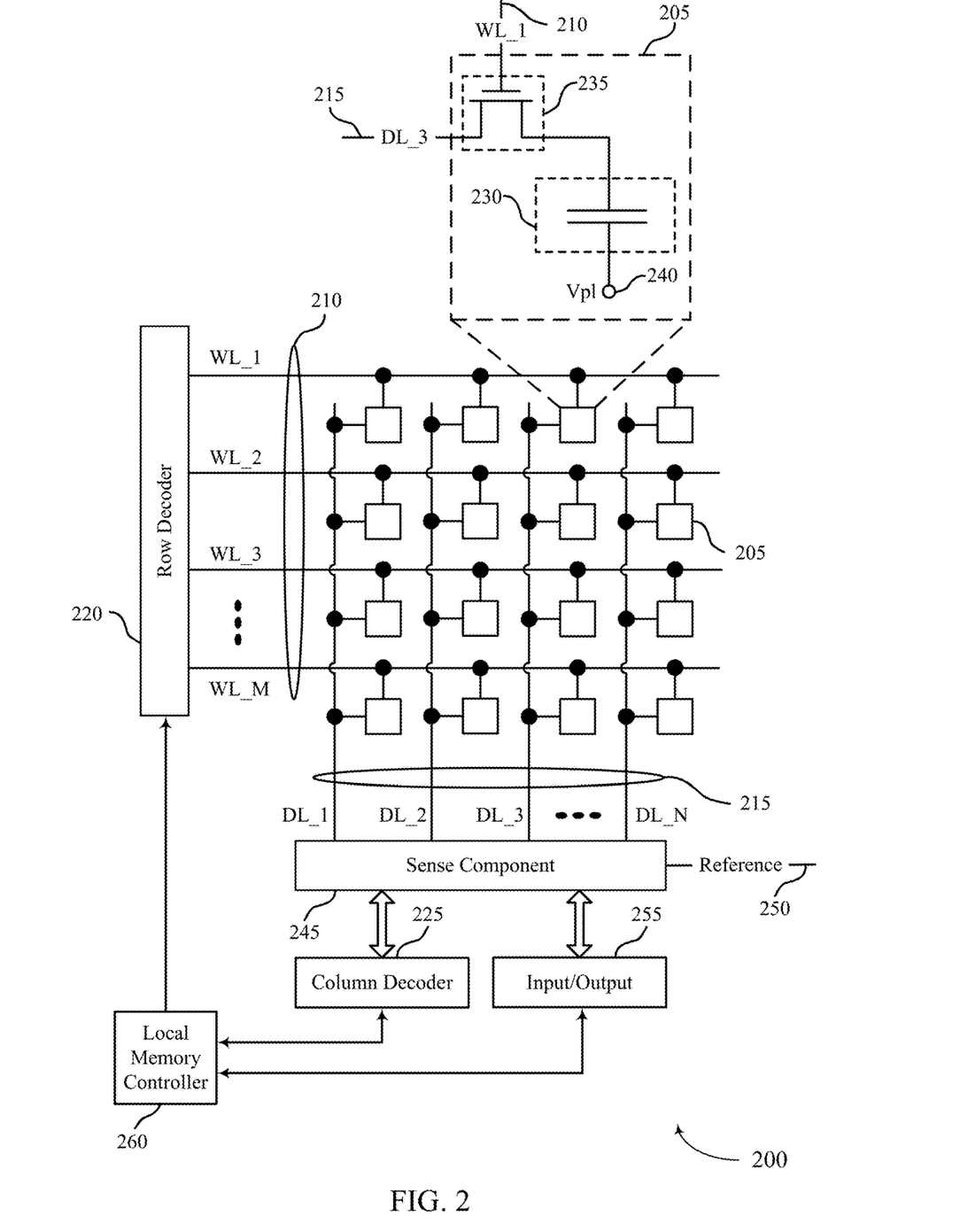
FIG. 2 illustrates an example of a memory die that supports pin mapping for memory devices in accordance with examples as disclosed herein.

FIG. 2 illustrates an example of a memory die 200 that supports pin mapping for memory devices in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

Figure 3A:
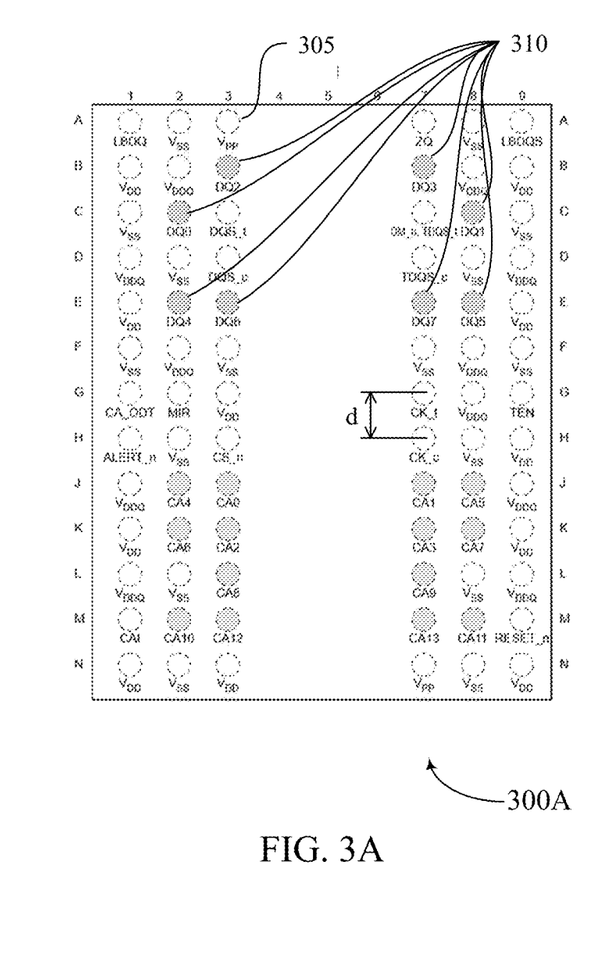
FIGS. 3A and 3B illustrate pinout diagrams that support pin mapping for memory devices in accordance with examples as disclosed herein.
Figure 3B:
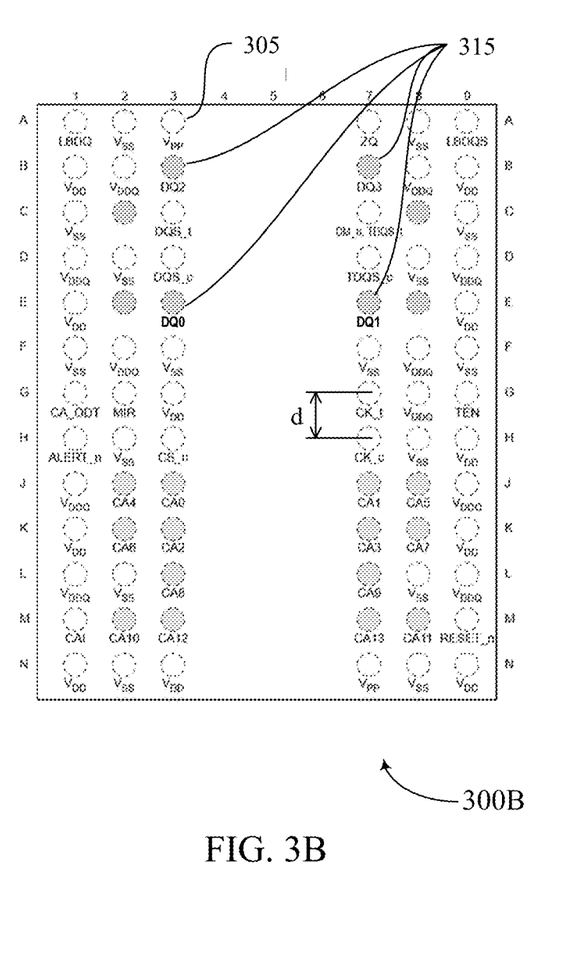

FIGS. 3A and 3B illustrate examples of pinout diagrams 300A and 300B that support pin mapping for memory devices in accordance with examples as disclosed herein. The pinout diagrams may show possible pinouts for ×8 and ×4 configurations that may diminish crosstalk between data lines in different ×4 configurations.

The pinout diagrams 300A and 300B illustrate pins 305 as they may be positioned on a DRAM package, along with signals corresponding to the pins. As shown in FIGS. 3A and 3B, the pins 305 are arranged in a grid having rows A-N and columns 1-9. To distinguish between the pins and the signals, each pin will be referred to by its position in the grid. For example, the pin associated with DQ2 may be referred to as pin B3 in both pinout diagrams and the pin associated with DQ0 may be referred to as pin C2 in pinout diagram 300A and pin E3 in pinout diagram 300B. The pins 305 may be dedicated to reference potentials (e.g., VDD, VDDQ, VPP, VSS), clock signals (e.g., CK_c, CK_t), control signals (e.g., CS_n, DM_n, DQS_c, DQS_t, LBDQS, RESET_n), status signals (e.g., ALERT_n, TDQS_c, TDQS_t), address lines (e.g., CA1-CA13), data lines (e.g., DQ0-DQ7) and other types of signals (e.g., CA_ODT, TEN, ZQ MIR).

Pinout diagram 300A may be used for an ×8 configuration or a first ×4 configuration. In an ×8 configuration, data lines 310 (e.g., data lines DQ0-DQ7) may be coupled to associated pins (e.g., pins C2, C8, B3, B7, E2, E8, E3, and E7) so as to be couplable to an external device, e.g., a host device. In a first ×4 configuration, a lower half-byte (or nibble) of data lines 310 (e.g., data lines DQ0-DQ3) may be couplable to an external device; an upper half-byte of data lines 310 (e.g., data lines DQ4-DQ7) may be ignored. As such, the lower half-byte of data lines 310 (e.g., data lines DQ0-DQ3) may be coupled to associated pins (e.g., pins C2, C8, B3, and B7) and the pins associated with the upper byte (e.g., data lines DQ4-DQ7) (e.g., E2, E8, E3, and E7) may be disconnected (e.g., on the memory die or between the memory die and the package) or tied to a high resistance or to ground.

A typical distance d between the centers of adjacent pins in the same row or column may be about 0.8 mm (although other distances are also possible). Based on this distance, the distance between any two pins of pinout 3A based on the row and column distances between the pins, may be determined using simple trigonometry (e.g., (row distance)$^2$+ (column distance)$^2$=(total distance)$^2$). So for an ×4 configuration using pinout diagram 300A, the total distance between the pins 305 associated with data lines DQ0-DQ3 may be as follows.

TABLE 1

Distance Between Data Line Pins of Pinout Diagram 300A

| Data Line (Pin) | DQ0 (C2) | DQ1 (C8) | DQ2 (B3) | DQ3 (B7) |
|---|---|---|---|---|
| DQ0 (C2) | — | 4.8 mm | 1.1 mm | 4.1 mm |
| DQ1 (C8) |  | — | 4.1 mm | 1.1 mm |
| DQ2 (B3) |  |  | — | 3.2 mm |
| DQ3 (B7) |  |  |  | — |

As shown in Table 1, the shortest distance between any two pins associated with data lines DQ0-DQ3 of pinout diagram 300A may be 1.1 mm, the distance between pins C2 and B3 (associated with data lines DQ0 and DQ2), or between pins C8 and B7 (associated with data lines DQ1 and DQ3).

Pinout diagram 300B may be used for a second ×4 configuration. In pinout diagram 300B, the same signals may be connected to the same pins as in pinout diagram 300A, with a few exceptions. As discussed above, when in an ×4 configuration, the upper half-byte of data lines (e.g., data lines DQ4-DQ7) may not be used. To take advantage of this, data lines DQ0 and DQ1 in FIG. 3B may be associated with pins E3 and E7, which were associated with data lines DQ6 and DQ7 in FIG. 3A. This changes the distances between the pins associated with the data lines 315 (e.g., DQ0-DQ3) as follows

TABLE 2

Distance Between Data Line Pins of Pinout Diagram 300B

| Data Line (Pin) | DQ0 (E3) | DQ1 (E7) | DQ2 (B3) | DQ3 (B7) |
|---|---|---|---|---|
| DQ0 (E3) | — | 3.2 mm | 2.4 mm | 4.0 mm |
| DQ1 (E7) |  | — | 4.0 mm | 2.4 mm |
| DQ2 (B3) |  |  | — | 3.2 mm |
| DQ3 (B7) |  |  |  | — |

As shown in Table 2, the shortest distance between any two pins associated with data lines DQ0-DQ3 of pinout diagram 300B may still be the distance between the pins associated with data lines DQ0 and DQ2 or between the pins associated with data lines DQ1 and DQ3, but because data lines DQ0 and DQ1 are now associated with pins E3 and E7, the distance is now 2.4 mm instead of 1.1 mm. This is more than twice as far as the shortest distance of pinout diagram 300A. In some examples, the pins selected for data lines for a second configuration (e.g., DQ0-DQ3) may be selected based on having a longest Euclidean distance between any two of the pins selected from the pins for a first configuration (e.g., ×8 configuration).

By remapping the DQ0 and DQ1 data lines to use the pins associated with unused data lines DQ6 and DQ7, the shortest distance between any of pins DQ0-DQ3 may be greater than they were in the pinout diagram 300A. This may help minimize crosstalk and other noise that may occur between data lines DQ0-DQ3 in the first ×4 configuration. The remaining unused pins may be disconnected (e.g., on the memory die between the memory die and package) or tied to a high or low potential (e.g., on the memory die or on the package).

Figure 4:
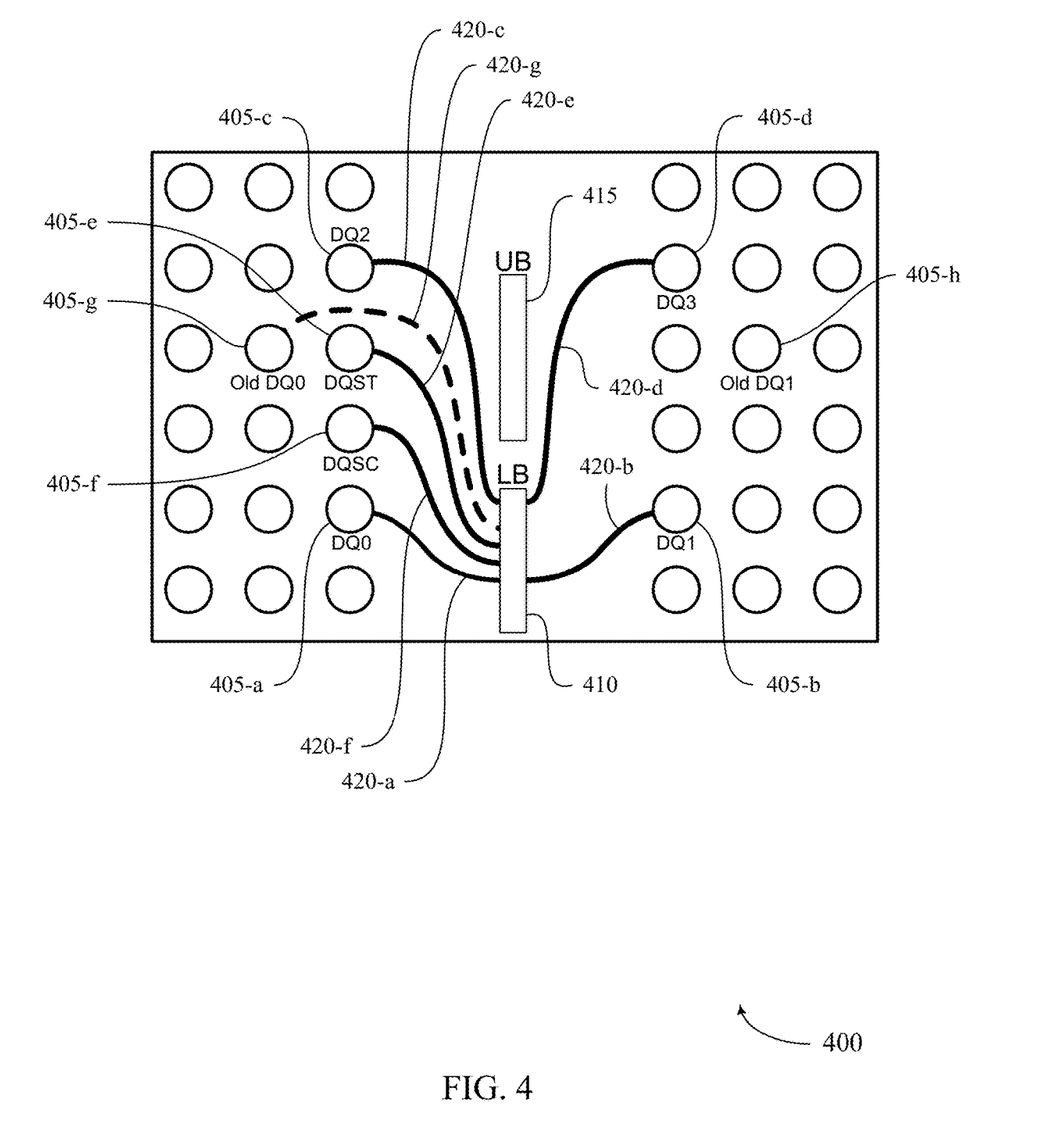
FIG. 4 illustrates an example of a package layout that supports pin mapping for memory devices in accordance with examples as disclosed herein.

FIG. 4 illustrates an example of a package layout 400 that supports pin mapping for memory devices in accordance with examples as disclosed herein. The package layout 400 may only show a portion of a full package layout. Package layout 400 may include a plurality of pins 405 (e.g., pins 405-a through 405-h) that may follow the same layout as pins 305 shown in FIG. 3B. Package layout 400 may also include a lower block (LB) connector 410 and an upper block (UB) connector 415. The address lines, the data lines, and the control lines corresponding to the upper portions of data lines may be coupled with the UB connector 415. The address lines, the data lines, and the control lines corresponding to the lower portions of data lines may be coupled with the LB connector 410.

The LB connector 410 and the UB connector 415 may each include connection points (not shown) for coupling with the pins 405 (e.g., bonding pads of the package). Traces (e.g., traces 420-a through 420-g) may extend between the pins 405 and associated connection points of the LB connector 410 or the UB connector 415. For example, traces 420-a, 420-b, 420-c, and 420-d may respectively couple pins 405-a, 405-b, 405-c, and 405-d with LB connector 410 so data lines DQ0-DQ3 may flow therethrough.

As shown in FIG. 4, depending on the position of the associated pin, a trace 420 may pass between two or more adjacent pins 405 to couple the pin to one of the connectors 410 or 415. For example, a trace 420-g from pin 405-g may pass between pins 405-c and 405-e, as shown by the dotted line. Pin 405-g may be associated with data line DQ0 of pinout 300A. By passing so close to pin 405-c, crosstalk may occur between the old data line DQ0 and data line DQ2. But by changing the pins to which data lines DQ0 and DQ1 are coupled, all of the pins associated with data lines DQ0-DQ3 (e.g., pins 405-a through 405-d) may be positioned on the column closest to the connectors 410 and 415. As such, traces associated with data lines DQ0-DQ3 (e.g., traces 420-a through 420-d) may pass directly from pins associated with data lines DQ0-DQ3 (e.g., pins 405-a through 405-d) to the LB connector, without passing between other pins 405. In addition, the placement of the pins associated with data lines DQ0 and DQ1 (e.g., pins 405-a and 405-b) may allow their associated traces (e.g., traces 420-a and 420-b) to be further away from the traces associated with data lines DQ2 and DQ3 (e.g., traces 420-c and 420-d), reducing crosstalk from those data lines. For example, instead of running alongside trace 420-c associated with data line DQ2, as trace 420-g of the old data line DQ0 might have, the trace 420-a associated with data line DQ0 may be significantly further away from trace 420-c associated with data line DQ2.

Figure 5:
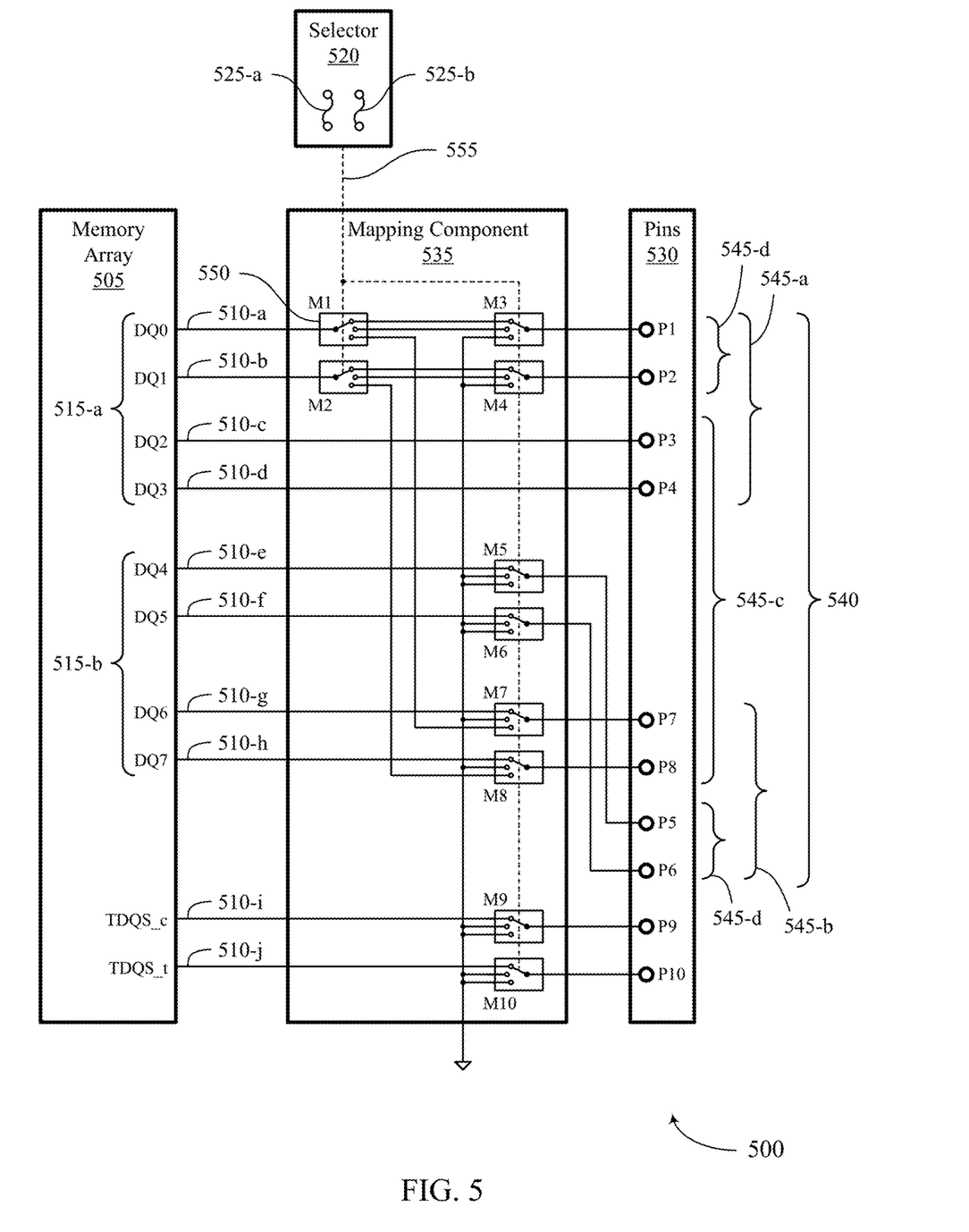
FIG. 5 illustrates a schematic of a memory device that supports pin mapping for memory devices in accordance with examples as disclosed herein.

FIG. 5 illustrates a schematic of a memory device 500 that supports pin mapping for memory devices in accordance with examples as disclosed herein. In some examples, memory device 500 may be a memory die (e.g., a DRAM chip or die). The schematic shows one example of a memory device capable of remapping data lines to pins to minimize cross talk and other noise as discussed above.

Memory device 500 may include a memory array 505 having a plurality of memory cells. In some examples, memory array 505 may be an example of memory array 170 described with reference to FIG. 1. In some examples, the memory cells may be an example of memory cells 205 described with reference to FIG. 2. Memory array 505 may include a plurality of lines 510 associated with data, such as data lines DQ0-DQ7 (e.g., lines 510-a through 510-h) and control lines, such as control lines TDQS (e.g., lines 510-i and 510-j). In some examples, the data lines may be examples of access lines 210 and 215 described with reference to FIG. 2. The plurality of lines 510 may be coupled with the memory cells, either directly or indirectly, for reading and writing operations, e.g., as discussed above.

The plurality of lines 510 may include sets of data lines 515, including a first set 515-a associated with a lower half-byte of data (e.g., lines 510-a through 510-d corresponding to data lines DQ0-DQ3) and a second set 510-b associated with an upper half-byte of data (e.g., lines 510-e through 510-h corresponding to data lines DQ4-DQ7). When the memory device 500 is in an ×8 configuration, upper and lower half-bytes of data may be passed to and from the memory array 505 using the first set of data lines 515-a and the second set of data lines 515-b. When the memory device 500 is in an ×4 configuration, lower half-bytes of data may be passed to and from the memory device using the first set of data lines 515-a; upper half-bytes of data may be ignored, so the second set of data lines 515-b may be unused.

A selector 520 may be used for selecting a desired configuration for the memory device 500. For example, the selector 520 may be used to select an ×4 or an ×8 configuration for the memory device 500. In some examples, the selector 520 may also be used to select between different pinouts of an ×4 configuration. For example, the selector 520 may be used to select a first ×4 configuration (e.g., corresponding to the ×4 pinout configuration discussed with reference to FIG. 3A) or a second ×4 configuration (e.g. corresponding to the ×4 pinout configuration discussed with reference to FIG. 3B). In some examples, the selector 520 may reflect a state based on the selection: e.g., a first state (e.g., an ×8 configuration), a second state (e.g., the first ×4 configuration), or a third state (e.g., the second ×4 configuration).

The selector 520 may be any type of selection device. In some cases, the selector 520 may include one or more one-time programmable elements, such as one or more fuses (e.g., fuses 525-a and 525-b).

Memory device 500 may include a plurality of pins 530 (e.g., pins P1-P10) for coupling the signals of the memory device 500 to external devices, e.g., a host device, such as host device 105 discussed with reference to FIG. 1. In one example, the plurality of lines 510 may be selectively coupled with the plurality of pins 530 to allow external devices (e.g. a host device) to access (e.g., read or write) the memory cells of the memory array 505.

Memory device 500 may include a mapping component 535. Mapping component 535 may be configured to selectively map (e.g., couple or attach) the plurality of lines 510 to the plurality of pins 530, based on the state reflected by the selector 520. For example, when the selector 520 reflects a first state (e.g., the ×8 configuration), the mapping component 520 may map the data lines (e.g., lines 510-a through 510-h corresponding to data lines DQ0-DQ7) to a first set of pins 540 (e.g., pins P1-P8).

In one example, the first set of data lines 515-a may be mapped to a first subset of pins 545-a (e.g., pins P1-P4) and the second set of data lines 515-*b* may be mapped to a second subset of pins 545-*b* (e.g., pins P5-P8), disjoint from the first subset 545-*a*. In some examples, the first and second subsets of pins 545-*a* and 545-*b* may make up the first set of pins 540.

When the selector 520 reflects a second state (e.g., the first ×4 configuration), the mapping component 520 may again map the first set of data lines 515-*a* to the first subset of pins 545-*a*. The selector 520 may also still map the second set of data lines 515-*b* to the second subset of pins 545-*b*, but because the upper half-byte of data may be unused in an ×4 configuration, the second set of data lines 545-*b* may not be mapped to the second subset of pins. In some examples, the second subset of pins 545-*b* may be coupled to a fixed potential (e.g., Vcc, Vpp, or Ground) in an ×4 configuration.

When the selector 520 reflects a third state (e.g., the second ×4 configuration), the mapping component 520 may map the first set of data lines 515-*a* to a third subset of pins 545-*c* (e.g., pins P3, P4, P7, and P8). The third subset of pins 545-*c* may be different than the first subset of pins 545-*a*. Because the upper half-byte of data lines unused in ×4 configurations, the second set of data lines may be unused and a fourth subset of pins 545-*d* (e.g., pins P1, P2, P5, and P6), disjoint from the third set of pins 545-*c*, may be uncoupled. In some examples, the third and fourth subsets of pins 545-*c* and 545-*d* may also make up the first set of pins 540. In some examples, one or more of the fourth set of pins may be coupled to a fixed potential (e.g., Vcc, Vpp, or Ground) in the second ×4 configuration. Coupling one or more of the fourth set of pins 545-*d* or pins associated with addition signals not used in the ×4 configuration (e.g., signal TDQS_c 510-*i* or TDQS_t 510-*j*) to a fixed potential may reduce cross-talk by providing shielding for the third set of pins 545-*c*. For example, a package (e.g., as shown by package layout 400) may include traces associated with the fourth set of pins 545-*d* or additional pins that are on one or more sides of traces associated with the third set of pins 545-*c*, and thus may reduce cross-talk from other surrounding traces.

The mapping component 535 may include one or more switching devices 550, such as multiplexers (e.g., multiplexers M1-M10) or tri-state drivers. A first set of multiplexers (e.g., M1 and M2) may each be configured to couple a data line 515 (e.g., data line DQ0 or DQ1) to one of three ports and a second set of multiplexers (e.g., M3-M10) may each be configured to couple a pin 530 (e.g., pin P1, P2, P5, P6, P7, P8, P9, or P10) to one of three ports. The specific output for each multiplexer 550 to use may be based on a control signal 555 received at the multiplexer, reflecting the state of the selector 520. In some examples, one or more data lines 515 may each be coupled with the same pin 530 in each configuration. For example, one or more data lines 515 (e.g., data lines DQ2 and DQ3) may each be coupled with a same pin (e.g., pins P3 and P4, respectively) in each of the ×8 configuration, the first ×4 configuration and the second ×4 configuration. In those cases, a switching device may be omitted for coupling those data lines and the associated pins.

As discussed above, the specific output for each multiplexer 550 to use may be based on the state of the selector 520. For example, when the selector 520 may reflect the ×8 configuration (e.g., the first state), the multiplexer M1 may couple data line DQ0 to pin P1 via multiplexer M3. Similarly, multiplexer M2 may couple data line DQ1 to pin P2 via multiplexer M4 in the first state and multiplexers M5-M8 may couple pins P5-P8 to data lines DQ4-DQ7, respectively. Since data lines DQ2 and DQ3 may be permanently coupled to pins P3 and P4, data lines DQ0-DQ7 may be coupled with pins P1-P8 in the first state. Thus, the first set of data lines 515-*a* and the second set of data lines 515-*b* may be coupled with the first subset of pins 545-*a* and the second subset of pins 545-*b* in the ×8 configuration.

When the selector 520 reflects the first ×4 configuration (e.g. the second state), the multiplexers M1 and M2 may again respectively couple data lines DQ0 and DQ1 to pins P1 and P2 via multiplexers M3 and M4, and data lines DQ2 and DQ3 may remain coupled to pins P3 and P4. Thus, the first set of data lines 515-*a* may be coupled with the first subset of pins 545-*a* in the first ×4 configuration. In some examples, since the upper half-byte of data lines may not be used in the ×4 configurations, multiplexers M5-M8 may uncouple the second subset of pins 545-*b* from the second set of data lines 515-*b*. In some examples, multiplexers M5-M8 may couple the second sunset of pins 545-*b* to a fixed potential, (e.g., ground).

When the selector 520 may reflect the second ×4 configuration (e.g. the third state), the multiplexers M1 and M2 may respectively couple data lines DQ0 and DQ1 to pins P7 and P8 via multiplexers M7 and M8. As such, data lines DQ0 and DQ1 may be coupled with different pins than in the first ×4 configuration. As such, the first set of data lines 515-*a* may be coupled with the third subset of pins 545-*c* in the second ×4 configuration. In some examples, since the upper bytes of data may not be used in the ×4 configurations, multiplexers M3-M6 may couple the fourth subset of pins (P1, P2, P7, and P8) to a fixed potential, (e.g., ground).

In some examples, pins associated with one or more control lines may also be coupled to a fixed potential when not being used. For example control lines TDQS_c and TDQS_t may only be used in the ×8 configuration. In some examples, pins associated with control lines TDQS_c and TDQS_t (e.g., pins P9 and P10) may be coupled to control line TDQS_c and TDQS_t (e.g., via multiplexers M9 and M10) in the ×8 configuration and may be coupled to a fixed potential (e.g., via multiplexers M9 and M10) in the ×4 configurations.

In some examples, the selector 520 may be in a preliminary state (e.g., the first state). When the selector 520 may be caused to move (e.g., by one or more fuses 525) to a different state (e.g., to the second or third states), the mapping component 535 may remap the data lines 515 to the pins 530 as discussed above. It should be understood that in some cases data lines 510 may include multiple data lines for bi-directional data. For example, some or all of pins 530 may be bi-directional, and thus the mapping component 535 may have multiple multiplexers 550 associated with each of pins 530 (e.g., one for each direction).

Figure 6:
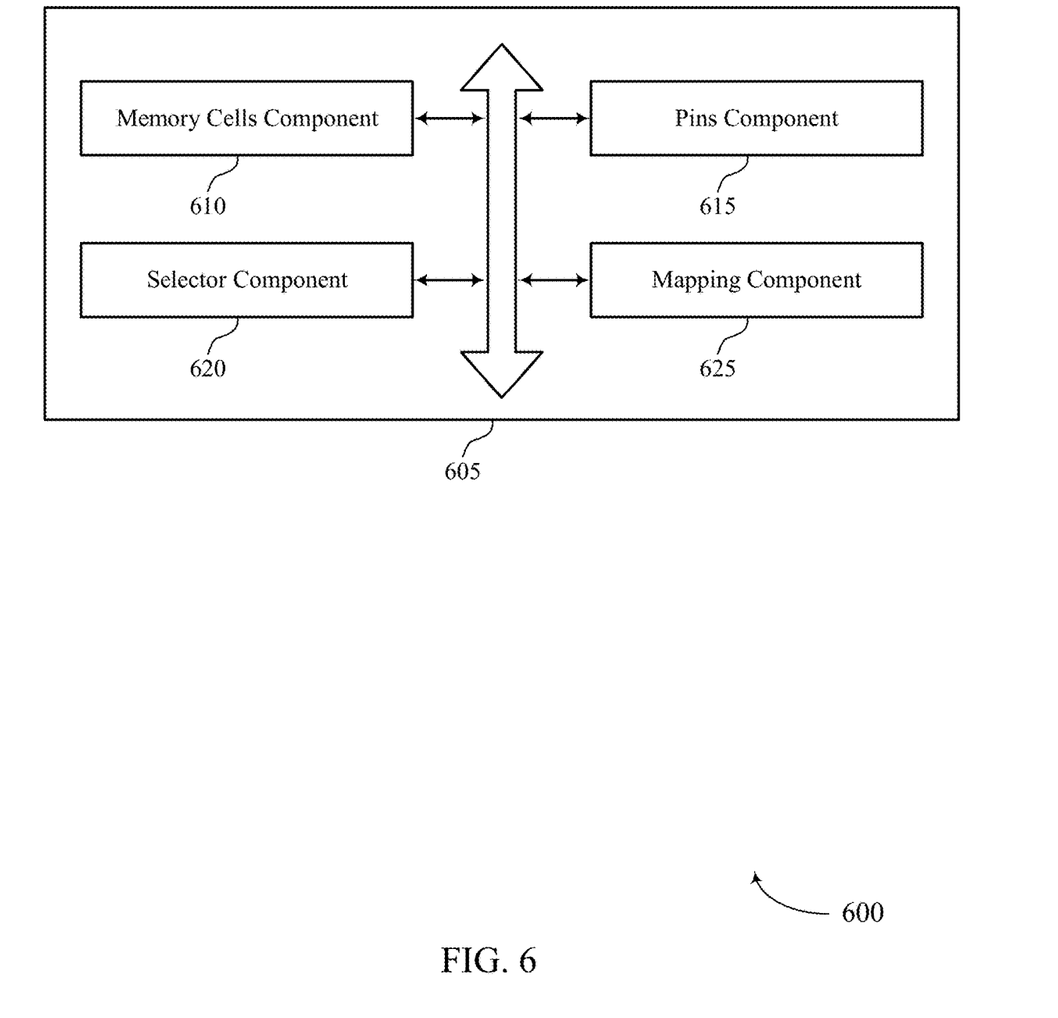
FIG. 6 shows a block diagram of a memory device that supports pin mapping for memory devices in accordance with aspects of the present disclosure.

FIG. 6 shows a block diagram 600 of a memory device 605 that supports pin mapping for memory devices in accordance with examples as disclosed herein. The memory device 605 may be an example of aspects of a memory device as described with reference to FIGS. 2 through 6. The memory device 605 may include a memory cells component 610, a pins component 615, a selector component 620, and a mapping component 625. Each of these modules may communicate, directly or indirectly, with one another (e.g., via one or more buses).

The memory cells component 610 may provide a set of memory cells and a set of data lines coupled with the set of memory cells.

The pins component 615 may provide a set of pins, the set of pins including a first set of pins and a second set of pins. The first set of pins may have a same quantity of pins as the second set of pins. A first pin of the first set of pins may not be included in the second set of pins and a second pin of the second set of pins may not be included in the first set of pins. In some cases, a shortest physical distance between any two pins of the second set of pins may be greater than a shortest physical distance between any two pins of the first set of pins. In some cases, the set of pins may further include a third set of pins. The first set of pins may be a first subset of the third set of pins, and the second set of pins may be a second subset of the third set of pins.

The selector component 620 may provide a selector. The selector component 620 may be or reflect a first state or a second state. In some examples, the selector component 620 may be in a first state. In some examples, the selector component 620 may cause the selector to move to a second state. In some cases, the selector component 620 may include a fuse element.

The mapping component 625 may provide a mapping component that maps the set of data lines to the first set of pins based on the first state of the selector. In some examples, the mapping component 625 may remap the set of data lines to the second set of pins, based on the selector moving to the second state.

Figure 7:
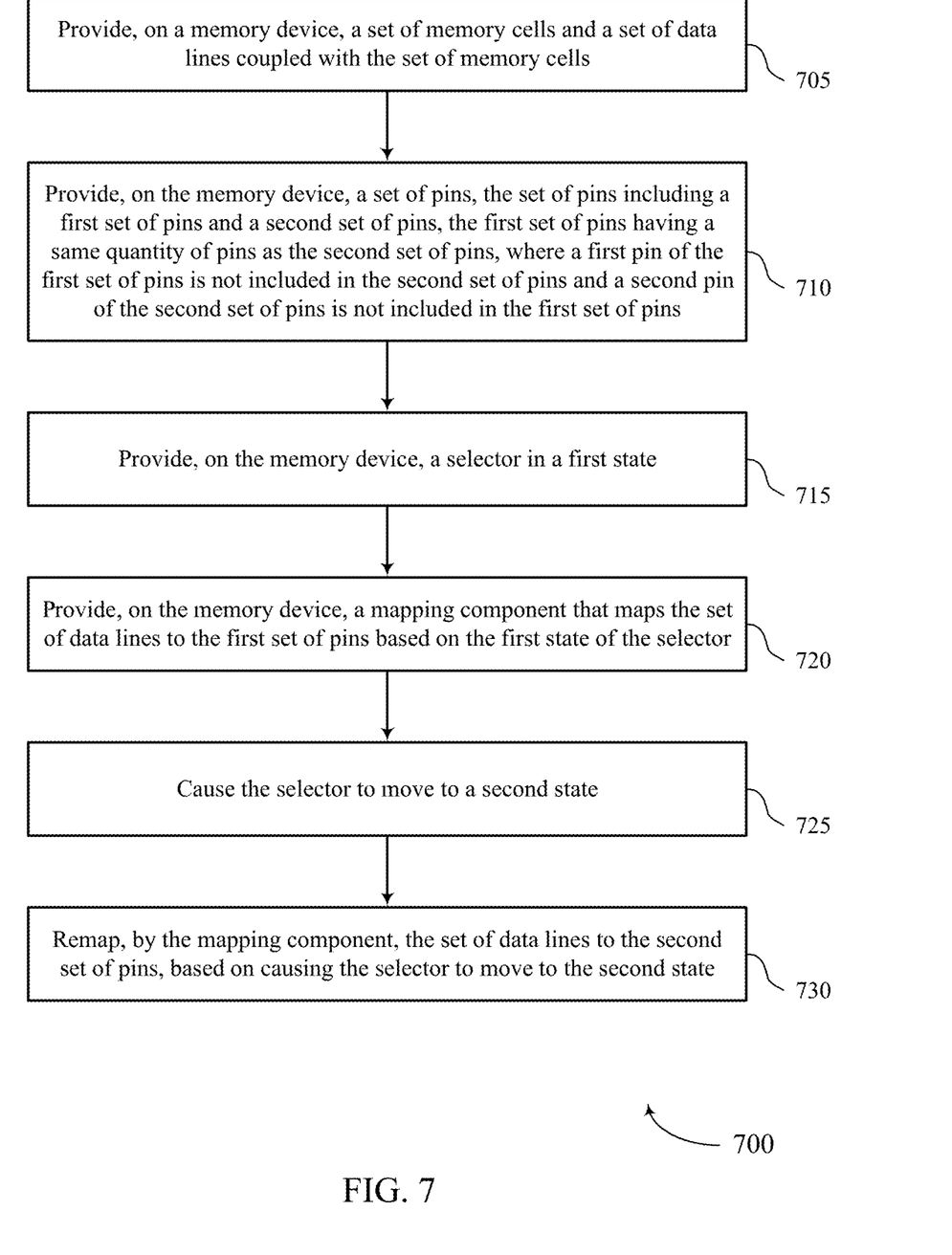
FIG. 7 shows a flowchart illustrating a method or methods that support pin mapping for memory devices in accordance with examples as disclosed herein.

FIG. 7 shows a flowchart illustrating a method 700 that supports pin mapping for memory devices in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may provide a set of memory cells and a set of data lines coupled with the set of memory cells. The operations of 705 may be performed according to the methods described herein. In some examples, aspects of the operations of 705 may be performed by a memory cells component as described with reference to FIG. 6.

At 710, the memory device may provide a set of pins that may include a first set of pins and a second set of pins. The first set of pins may have a same quantity of pins as the second set of pins. A first pin of the first set of pins may not be included in the second set of pins and a second pin of the second set of pins may not be included in the first set of pins. The operations of 710 may be performed according to the methods described herein. In some examples, aspects of the operations of 710 may be performed by a pins component as described with reference to FIG. 6.

At 715, the memory device may provide a selector in a first state. The operations of 715 may be performed according to the methods described herein. In some examples, aspects of the operations of 715 may be performed by a selector component as described with reference to FIG. 6.

At 720, the memory device may provide a mapping component that maps the set of data lines to the first set of pins based on the first state of the selector. The operations of 720 may be performed according to the methods described herein. In some examples, aspects of the operations of 720 may be performed by a mapping component as described with reference to FIG. 6.

At 725, the selector may be caused to move to a second state. The operations of 725 may be performed according to the methods described herein. In some examples, aspects of the operations of 725 may be performed by a selector component as described with reference to FIG. 6.

At 730, the memory device may remap the set of data lines to the second set of pins, based on the selector moving to the second state. The operations of 730 may be performed according to the methods described herein. In some examples, aspects of the operations of 730 may be performed by a mapping component as described with reference to FIG. 6.

In some examples, an apparatus as described herein may perform a method or methods, such as the method 700. The apparatus may include features, means, or instructions for providing, on a memory device, a set of memory cells and a set of data lines coupled with the set of memory cells; providing, on the memory device, a set of pins, the set of pins including a first set of pins and a second set of pins, the first set of pins having a same quantity of pins as the second set of pins, where a first pin of the first set of pins is not included in the second set of pins and a second pin of the second set of pins is not included in the first set of pins; providing, on the memory device, a selector in a first state; providing, on the memory device, a mapping component that maps the set of data lines to the first set of pins based on the first state of the selector; causing the selector to move to a second state; and remapping, by the mapping component, the set of data lines to the second set of pins, based on causing the selector to move to the second state.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory array, a set of pins, a selector, and a mapping component. The memory array may have a set of memory cells and data lines coupled with the memory cells. The set of pins may have a first set of pins and a second set of pins. The second set of pins may have a same quantity of pins as the first set of pins. The selector may reflect a state including a first state or a second state. The mapping component may be configured to selectively map the set of data lines to the set of pins based on the state reflected by the selector. A first pin of the first set of pins may not be included in the second set of pins and a second pin of the second set of pins may not be included in the first set of pins. The mapping component may be configured to map the set of data lines to the first set of pins when the selector reflects the first state. The mapping component may be configured to map the set of data lines to the second set of pins when the selector reflects the second state.

In some examples, the set of pins may further include a third set of pins, the state may further include a third state, and the mapping component may be configured to map the set of data lines to the third set of pins when the selector reflects the third state. In some examples, the first set of pins may be a first subset of the third set of pins, and the second set of pins may be a second subset of the third set of pins. In some examples, the third set of pins may have a different quantity of pins than the first set of pins and the second set of pins. In some examples, the quantity of the first set of pins may be four, and the quantity of the third set of pins may be eight.

In some examples, the mapping component may be configured to couple one or more pins of the first set of pins to a fixed potential when the selector reflects the second state. In some examples, the selector may include a one-time programmable element. In some examples, the one-time programmable element may include a fuse element. In some examples, the mapping component may include a multiplexer. In some examples, the mapping component may include a tri-state driver. In some examples, a shortest physical distance between any two pins of the second set of pins may be greater than a shortest physical distance between any two pins of the first set of pins.

An apparatus is described. The apparatus may include a memory array, a set of pins, a selector, and a mapping component. The memory array may include a set of memory cells and a set of lines associated with data. The set of lines may be coupled with the set of memory cells. The set of lines may include a first set of data lines and a second set of data lines.

The set of pins may include a first subset of pins and a second subset of pins that is a disjoint subset of pins from the first subset of pins. The set of pins may also include a third subset of pins and a fourth subset of pins that is a disjoint subset of pins from the third subset of pins. The selector may be in a state that may include a first state or a second state. The mapping component may be configured to selectively map the set of lines to pins of the set of pins based on the state of the selector. The mapping component may be configured to map the first set of data lines to the first subset of pins and the second set of data lines to the second subset of pins when the selector is in the first state. The mapping component may be configured to map the first set of data lines to the third subset of pins and couple the fourth subset of pins to a fixed potential when the selector is in the second state.

In some examples, the selector may include a fuse element. In some examples, each of the first subset of pins, the second subset of pins, the third subset of pins, and the fourth subset of pins may have a same quantity of pins. In some examples, the mapping component may include a multiplexer. In some examples, the set of lines may further include a fifth set of control lines. The set of pins may further include a fifth subset of pins. The mapping component may be configured to map the fifth set of control lines to the fifth subset of pins when the selector may be in the first state, and the mapping component may be configured to couple the fifth subset of pins to the fixed potential when the selector may be in the second state.

In some examples, a shortest physical distance between any two pins of the third set of pins may be greater than a shortest physical distance between any two pins of the first set of pins. In some examples, the selector may include a fuse element. In some examples, the set of pins may further include a fifth set of pins, where the first set of pins may be a first subset of the fifth set of pins, and the second set of pins may be a second subset of the fifth set of pins.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device comprising:
a memory array comprising a plurality of memory cells and a plurality of data lines coupled with the plurality of memory cells;
a plurality of pins comprising a first set of pins and a second set of pins having a same quantity of pins as the first set of pins, wherein a first pin of the first set of pins is not included in the second set of pins and a second pin of the second set of pins is not included in the first set of pins;
a selector that reflects a state comprising a first state or a second state; and
a mapping component that is configured to selectively map the plurality of data lines to the plurality of pins based at least in part on the state reflected by the selector, wherein the mapping component is configured to map a set of the plurality of data lines to the first set of pins when the selector reflects the first state, the first set of pins configured to couple the set of the plurality of data lines with a host device external to the memory device based on the selector reflecting the first state to allow the host device to access the plurality of memory cells via the first set of pins, and wherein the mapping component is configured to map the set of the plurality of data lines to the second set of pins when the selector reflects the second state, the second set of pins configured to couple the set of the plurality of data lines with the host device based on the selector reflecting the second state to allow the host device to access the plurality of memory cells via the second set of pins.

2. The memory device of claim 1, wherein:
the plurality of pins further comprises a third set of pins, the state further comprises a third state, and
the mapping component is configured to map the plurality of data lines to the third set of pins when the selector reflects the third state, the third set of pins configured to couple the plurality of data lines with the host device to allow the host device to access the plurality of memory cells via the third set of pins.

3. The memory device of claim 2, wherein:
the first set of pins is a first subset of the third set of pins, and
the second set of pins is a second subset of the third set of pins.

4. The memory device of claim 2, wherein the third set of pins has a different quantity of pins than the first set of pins and the second set of pins.

5. The memory device of claim 4, wherein the quantity of the first set of pins is four and the quantity of the third set of pins is eight.

6. The memory device of claim 1, wherein the mapping component is configured to couple one or more pins of the first set of pins to a fixed potential when the selector reflects the second state.

7. The memory device of claim 1, wherein the selector comprises a one-time programmable element.

8. The memory device of claim 7, wherein the one-time programmable element comprises a fuse element.

9. The memory device of claim 1, wherein the mapping component comprises a multiplexer.

10. The memory device of claim 1, wherein the mapping component comprises a tri-state driver.

11. The memory device of claim 1, wherein a shortest physical distance between any two pins of the second set of pins is greater than a shortest physical distance between any two pins of the first set of pins.

12. The memory device of claim 1, wherein the memory device is a random access memory package or a random access memory die.

13. A memory device comprising:
   a memory array comprising a plurality of memory cells and a plurality of lines associated with data, the plurality of lines coupled with the plurality of memory cells, the plurality of lines comprising a first set of data lines and a second set of data lines;
   a set of pins comprising a first subset of pins and a second subset of pins that is a disjoint subset of pins from the first subset of pins, the set of pins also comprising a third subset of pins and a fourth subset of pins that is a disjoint subset of pins from the third subset of pins;
   a selector in a state, the state comprising a first state or a second state; and
   a mapping component configured to selectively map the plurality of lines to pins of the set of pins based at least in part on the state of the selector, wherein the mapping component is configured to map the first set of data lines to the first subset of pins and the second set of data lines to the second subset of pins when the selector is in the first state, the first subset of pins and the second subset of pins configured to couple the first set of data lines and the second set of data lines with a host device external to the memory device when the selector is in the first state to allow the host device to access the plurality of memory cells via the first subset of pins and the second subset of pins, and wherein the mapping component is configured to map the first set of data lines to the third subset of pins and couple the fourth subset of pins with a fixed potential when the selector is in the second state, the third subset of pins configured to couple the first set of data lines with the host device when the selector is in the second state to allow the host device to access the plurality of memory cells via the third subset of pins.

14. The memory device of claim 13, wherein the selector comprises a fuse element.

15. The memory device of claim 13, wherein each of the first subset of pins, the third subset of pins, and the fourth subset of pins and the second subset of pins have a same quantity of pins.

16. The memory device of claim 13, wherein the mapping component comprises a multiplexer.

17. The memory device of claim 13, wherein the plurality of lines further comprises a third set of control lines and the set of pins further comprises a fifth subset of pins, and wherein the mapping component is configured to map the third set of control lines to the fifth subset of pins when the selector is in the first state, and to couple the fifth subset of pins to the fixed potential when the selector is in the second state, the fifth subset of pins configured to couple the third set of control lines to the host device.

18. An apparatus prepared by a process comprising steps of:
   providing, on a memory device, a plurality of memory cells and a plurality of data lines coupled with the plurality of memory cells;
   providing, on the memory device, a plurality of pins, the plurality of pins comprising a first set of pins and a second set of pins, the first set of pins having a same quantity of pins as the second set of pins, wherein a first pin of the first set of pins is not included in the second set of pins and a second pin of the second set of pins is not included in the first set of pins;
   providing, on the memory device, a selector in a first state;
   providing, on the memory device, a mapping component that maps the plurality of data lines to the first set of pins based at least in part on the first state of the selector, the first set of pins configured to couple the plurality of data lines with a host device external to the apparatus based on the selector being in the first state to allow the host device to access the plurality of memory cells via the first set of pins;
   causing the selector to move to a second state; and
   remapping, by the mapping component, the plurality of data lines to the second set of pins, based at least in part on causing the selector to move to the second state, the second set of pins configured to couple the plurality of data lines with the host device based on the selector being in the second state to allow the host device to access the plurality of memory cells via the second set of pins.

19. The apparatus of claim 18, wherein a shortest physical distance between any two pins of the second set of pins is greater than a shortest physical distance between any two pins of the first set of pins.

20. The apparatus of claim 18, wherein the selector comprises a fuse element.

21. The apparatus of claim 18, wherein:
   the plurality of pins further comprises a fifth set of pins, wherein the first set of pins is a first subset of the fifth set of pins, and the second set of pins is a second subset of the fifth set of pins.

* * * * *